(12) United States Patent
Chen et al.

(10) Patent No.: US 9,263,604 B2
(45) Date of Patent: *Feb. 16, 2016

(54) WAFER SCALE IMAGE SENSOR PACKAGE AND OPTICAL MECHANISM INCLUDING THE SAME

(71) Applicant: PixArt Imaging Inc., Hsin-Chu County (TW)

(72) Inventors: Hui-Hsuan Chen, Hsin-Chu County (TW); Tien-Chia Liu, Hsin-Chu County (TW); Chia-Hsin Yu, Hsin-Chu County (TW)

(73) Assignee: PIXART IMAGING INC., Hsin-Chu County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/675,072

(22) Filed: Nov. 13, 2012

(65) Prior Publication Data
US 2013/0147000 A1 Jun. 13, 2013

(30) Foreign Application Priority Data

Dec. 7, 2011 (TW) .............................. 100144986 A
Jun. 11, 2012 (TW) .............................. 101120894 A
Aug. 23, 2012 (CN) .......................... 2012 1 0302864

(51) Int. Cl.
H01L 31/02 (2006.01)
H01L 31/0232 (2014.01)
H01L 31/0216 (2014.01)

(52) U.S. Cl.
CPC ...... *H01L 31/0232* (2013.01); *H01L 31/02162* (2013.01); *H01L 31/02327* (2013.01)

(58) Field of Classification Search
CPC ..................... H01L 31/0232; H01L 31/02162; H01L 31/02327
USPC .............................................. 257/98–99, 432
See application file for complete search history.

(56) References Cited

U.S. PATENT DOCUMENTS

| 6,496,285 | B1 * | 12/2002 | Fujimoto et al. | 358/475 |
| 7,458,703 | B2 * | 12/2008 | Han et al. | 362/267 |
| 2003/0184725 | A1 | 10/2003 | Takaoka et al. | |
| 2006/0181633 | A1 * | 8/2006 | Seo | 348/340 |
| 2007/0210267 | A1 * | 9/2007 | Ishii et al. | 250/559.36 |
| 2010/0045963 | A1 * | 2/2010 | Yamaguchi et al. | 356/4.01 |
| 2011/0156188 | A1 * | 6/2011 | Tu et al. | 257/432 |
| 2011/0248287 | A1 * | 10/2011 | Yuan et al. | 257/88 |
| 2012/0007202 | A1 | 1/2012 | Mueller et al. | |

FOREIGN PATENT DOCUMENTS

| TW | 200834938 A | 8/2008 |
| TW | M363080 U | 8/2009 |
| WO | 2010/103047 A1 | 9/2010 |

* cited by examiner

*Primary Examiner* — Trang Tran
(74) *Attorney, Agent, or Firm* — Hauptman Ham, LLP

(57) ABSTRACT

There is provided an optical mechanism including a substrate, an image sensor chip, a light source, a blocking member and a securing member. The image sensor chip is attached to the substrate and has an active area. The light source is attached to the substrate. The blocking member covers the image sensor chip and has an opening to expose at least the active area of the image sensor chip. The securing member fits on the blocking member to secure the blocking member to the substrate.

15 Claims, 2 Drawing Sheets

WAFER SCALE IMAGE SENSOR PACKAGE AND OPTICAL MECHANISM INCLUDING THE SAME

CROSS REFERENCE TO RELATED APPLICATION

This application claims the priority benefit of Taiwan Patent Application Serial Number 100144986, filed on Dec. 7, 2011 and Taiwan Patent Application Serial Number 101120894, filed on Jun. 11, 2012, the full disclosure of which are incorporated herein by reference.

BACKGROUND

1. Field of the Disclosure

This disclosure generally relates to an optical mechanism applied to wafer scale packaging and, more particularly, to an optical mechanism using an image sensor whose semiconductor structure is sealed by transparent materials in wafer scale packaging.

2. Description of the Related Art

Presently, the image sensor chip is manufactured by cutting a die from a silicon wafer and then sealing the die with various packaging technologies such as iDip, LGA or COB technology. These packaging technologies are well known to those skilled in the art and thus details thereof are not described herein.

A common feature of the image sensor chips packaged by the above packaging technologies is that the chips are covered by a black cavity and this is a general type of the chip package nowadays. To image sensor chips, this feature can block ambient light outside the package such that an image sensor chip may be directly applied to various applications, e.g. an optical mouse, after being packaged. The image sensor chip may be directly positioned and fixed at a desired height such that it is able to detect reflected light from a table surface to perform optical navigation.

However, with the development of the semiconductor fabrication technology, the wafer scale packaging has become a mature technology. In the wafer scale packaging, it may use transparent materials, e.g. glass or epoxy, to enclose the die to form a package structure; for example, Chip Scale Package (CSP) technology, Through-Silicon Via (TSV) technology and OPLGA technology may perform the packaging process by using transparent glass or epoxy to seal the die. Therefore in the application of an image sensor chip, this kind of chip package does not have a black cavity such that ambient light outside the image sensor chip may pass through the transparent glass or epoxy to influence the operation of the image sensor chip.

Accordingly, there is a need to provide a novel optical mechanism and positioning structure capable of being applied to a wafer scale packaging.

SUMMARY

It is an object of the present disclosure to provide an optical mechanism and positioning structure applied to wafer scale packaging and, more particularly, to a wafer scale image sensor package. As transparent materials, such as glass or epoxy, may be used in wafer scale packaging to enclose an outer surface of the semiconductor circuit, the fabricated wafer scale image sensor package does not include a black cavity to block ambient light. Therefore, the present disclosure provides an optical mechanism and positioning structure configured to tightly secure the packaged chip and the optical mechanism and/or positioning structure to a substrate, e.g. a printed circuit mother board (PCB), and block or absorb unnecessary light. To image sensor chips configured to detect light and accordingly generate image signals, it is able to effectively prevent the image sensor chips from being interfered by ambient light to degrade the performance.

The present disclosure provides a wafer scale image sensor package including a die, an intermediate layer and a transparent layer. The die has an active area on a sensing surface thereof. The intermediate layer is disposed on the sensing surface and surrounds the active area. The transparent layer is combined to the die through the intermediate layer, wherein a filter layer is formed on at least a partial surface of the transparent layer.

The present disclosure further provides an optical mechanism including a substrate, a wafer scale image sensor package, a light source, a blocking member and a securing member. The wafer scale image sensor package is attached to a front side of the substrate and has an active area. The light source is attached to the front side of the substrate. The blocking member covers the wafer scale image sensor package and has an opening to expose at least the active area of the wafer scale image sensor package. The securing member fits on the blocking member to secure the blocking member to the substrate, wherein the securing member has a first transparent area associated with the light source and a second transparent area associated with the opening of the blocking member.

The present disclosure further provides an optical mechanism of an optical mouse including a substrate, a wafer scale image sensor package, a light source, a blocking member and a securing member. The wafer scale image sensor package and the light source are attached to the substrate. The blocking member covers a part of the wafer scale image sensor package and surrounds the light source. The securing member fits on the blocking member to secure the blocking member to the substrate.

In the optical mechanism of the present disclosure, the first transparent area is configured to allow the light emitted from the light source to emanate from the optical mechanism and reach a reflecting surface; and the second transparent area is configured to allow reflected light from the reflecting surface outside the optical mechanism to pass through and reach the active area via the opening.

In the optical mechanism of the present disclosure, the wafer scale image sensor package has a sensing surface and a backside opposite to each other, wherein the wafer scale image sensor package is mounted to the front side of the substrate via the backside thereof; and a circuit layout is formed on the front side of the substrate to connect to the wafer scale image sensor package.

In the wafer scale image sensor package of the present disclosure, a filter layer of wavelength of interest is coated on at least a partial surface of the transparent layer and/or the sensing surface of the die to allow light of the wavelength of interest to pass through; for example, an infrared and blue filter (B+IR pass filter) allows blue light and infrared light to pass through and an IR pass filter allows infrared light to pass through.

In the wafer scale image sensor package of the present disclosure, at least one reflecting layer, which contains metal components, is coated on at least a partial surface of the transparent layer and/or the sensing surface of the die such that radiation of specific wavelengths may be reflected by the reflecting layer and not enter the image sensor chip.

In the optical mechanism of the present disclosure, a blocking member is provided to cover the wafer scale image sensor package and the blocking member is cooperated with a securing member. The securing member is fixed on the substrate and directly secures the blocking member at the same time. Therefore, after the securing member is fixed on the substrate, the securing member, the blocking member and the wafer scale image sensor package may keep stable relative positions and the blocking member may prevent ambient light from entering the image sensor chip.

In the optical mechanism of the present disclosure, the wafer scale image sensor package may be directly bonded to the substrate and then the blocking member is covered on the wafer scale image sensor package to keep a relative position. Finally, the securing member is fit on the blocking member and fixed on the substrate. In this manner, the securing member, the blocking member and the wafer scale image sensor package may keep stable relative positions.

In other aspects, the blocking member itself may be directly fixed on the substrate and then the securing member is fit on the blocking member and fixed on the substrate.

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be mentioned that in the embodiments and drawings mentioned herein, components irrelevant to the present invention are omitted and the proportional relationship between every component is for illustration purpose but not to limit the actual proportion thereof.

Figure 1:
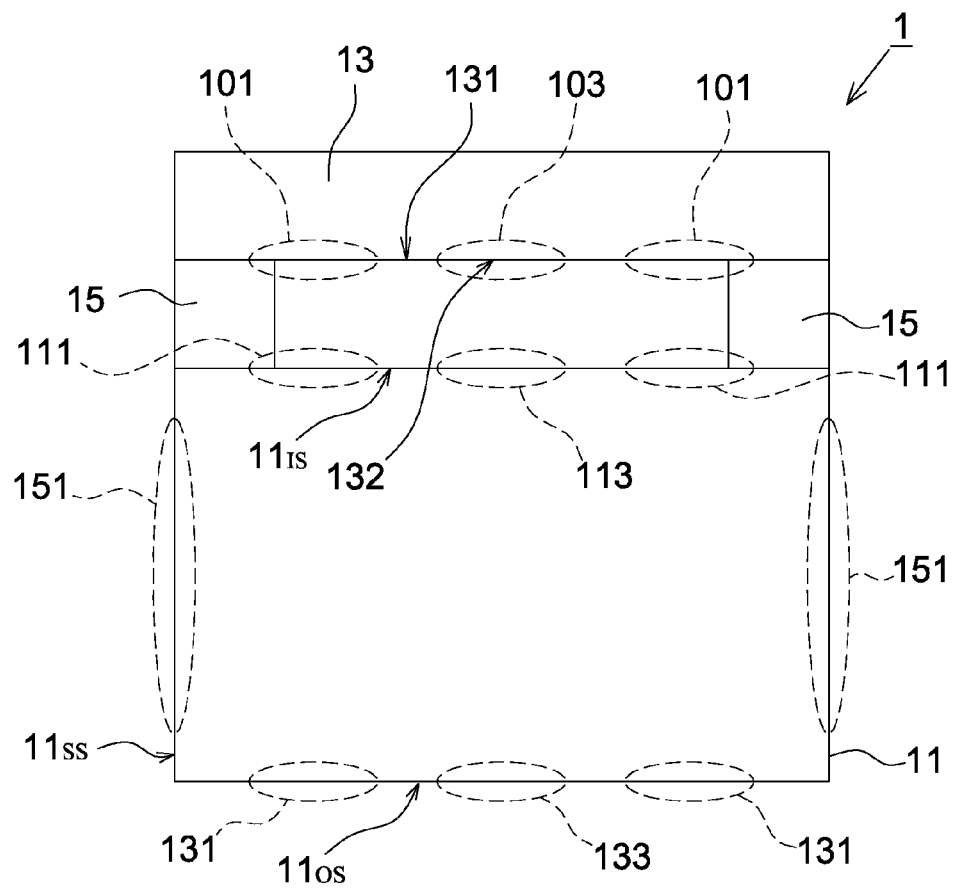
FIG. 1 shows a schematic diagram of the wafer scale image sensor package according to an embodiment of the present disclosure.

FIG. 1 shows a schematic diagram of the wafer scale image sensor package according to an embodiment of the present disclosure. The wafer scale image sensor package 1 includes a transparent layer 11, a die 13 and an intermediate layer 15, wherein the transparent layer 11 may be a glass layer or an epoxy layer, and the intermediate layer 15 is disposed between the die 13 and the transparent layer 11 to function as a buffer and combination between the transparent layer 11 and the die 13. The die 13 may be a light sensing element which is a semiconductor circuit formed on a silicon wafer. The die 13 has an active area 132 on a sensing surface 131 thereof, wherein the active area 132 may be located substantially at a center area of the sensing surface 131, but not limited thereto. The intermediate layer 15 is disposed on the sensing surface 131 and surrounds the active area 132, and preferably the intermediate layer 15 does not block the active area 132. The transparent layer 11 has an inner surface $11_{IS}$ facing the die 13, an exterior surface $11_{OS}$ opposite to the inner surface $11_{IS}$ and a lateral surface $11_{SS}$. In this embodiment, a filter layer and/or a reflecting layer is formed on at least a partial surface of the transparent layer 11 and/or the sensing surface 131 of the die 13 (described later).

In this embodiment, the reflecting layer may be coated on at least one of the locations 101, 111, 131 and 151. The filter layer of wavelength of interest may be coated on at least one of the locations 103, 113 and 133. That is, the filter layer may be formed on at least a partial surface of at least one of the inner surface $11_{IS}$, the exterior surface $11_{OS}$ and the sensing surface 131 of the die 13, wherein the filter layer is preferably opposite to the active area 132 of the die 13; and the reflecting layer may be formed on at least a partial surface of at least one of the inner surface $11_{IS}$, the exterior surface $11_{OS}$, the lateral surface $11_{SS}$ and the sensing surface 131 of the die 13. As the reflecting layer may contain metal components such as Chromium or others, it is able to effectively limit the light to enter the transparent layer 11 or the die 13 through the area without being coated with the reflecting layer. The filter layer of wavelength of interest and the reflecting layer may be partially overlapped and will not interfere with each other. In this embodiment, the locations 103, 113 and 133 are effective fields of view of the light sensing element and the effective fields of view are preferably opposite to the active area 132.

If the reflecting layer has to be formed at a higher temperature, materials of the transparent layer 11 may select those that can tolerate a high temperature, such as the glass material, and the epoxy material is not suitable in this case.

The filter layer of wavelength of interest is configured to allow light of the wavelength of interest to pass through, such as an infrared and blue filter (B+IR pass filter) may allow blue light and infrared light to pass through, and an IR pass filter may allow infrared light to pass through. According to different designs of the chip 1, different filter layers may be used. For example, in an optical mouse using a light source emitting blue light, the B+IR pass filter may be used; and in an optical mouse using a light source emitting invisible light, the IR pass filter may be used.

For the filter layer having soft material, it is not suitable to be coated on the outer surface of the wafer scale image sensor package 1; that is, it is not suitable to be coated at the location 133 in order to prevent the filter layer from being damaged or scratched. In this case, the filter layer is preferably formed on the inner surface $11_{IS}$ of the transparent layer 11 or directed coated on the sensing surface 131 of the die 13.

The aforementioned filter layer and the reflecting layer may be simultaneously coated on different locations according to different designs of the optical mechanism and the light sensing element such that the reflecting and the absorbing effects may satisfy the design requirement, e.g. coating the filter layer on both locations 103 and 113.

In another embodiment, if the light to be received is visible light, an IR pass filter may be used to absorb or block the visible light. In this embodiment, the IR pass filter may be coated on the locations coated with the reflecting layer described in the previous embodiment; i.e. at least one of the locations 101, 111, 131 and 151, to be served as an absorption layer. As the IR pass filter can absorb visible light, areas without being coated with the IR pass filter may allow visible light to pass through so as to achieve the object of limiting the penetration of the visible light. In other words, whether a reflecting layer or an absorption layer is formed on the transparent layer 11 and the sensing surface 131 of the die 13 is determined according to the operation property of the light sensing element.

Figure 2:
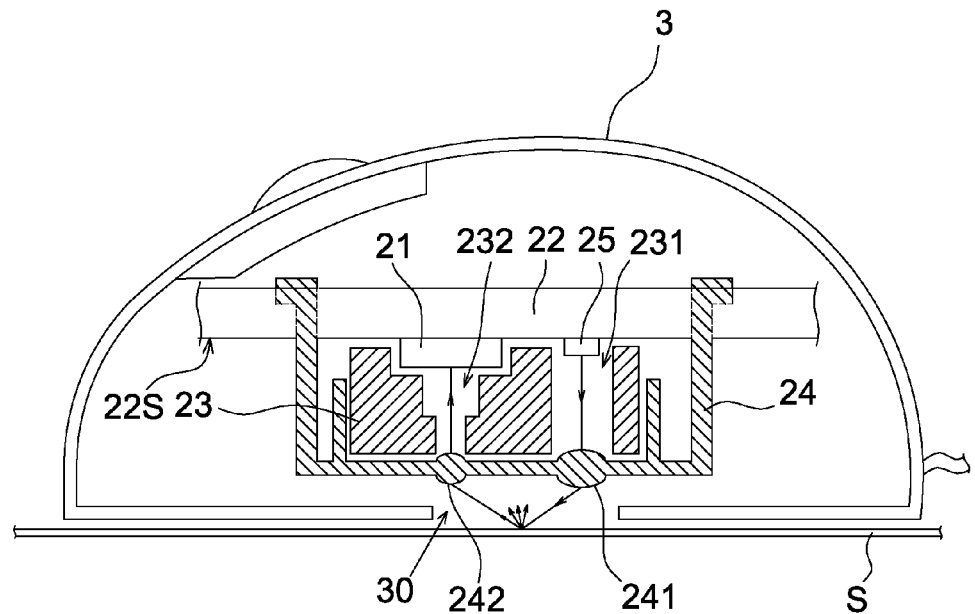
FIG. 2 shows a schematic diagram of an optical mechanism and an optical mouse including the optical mechanism according to an embodiment of the present disclosure.

FIG. 2 shows a schematic diagram of an optical mechanism according to the embodiment of the present disclosure, wherein the wafer scale image sensor package 21 (may be referred to a chip 21 hereinafter) is an image sensor chip packaged by wafer scale packaging as shown in FIG. 1. That is, the chip 21 includes a die 13 and a transparent layer 11 combined together through an intermediate layer 15. FIG. 2 shows a schematic diagram of the optical mechanism applied to an optical mouse and thus a light source 25 is further included therein. The light source 25 emits light to pass through the securing member 24 to reach a reflecting surface S, and reflected light from the reflecting surface S passes through the securing member 24 again to reach the chip 21.

More specifically, the optical mechanism of the present disclosure includes a substrate 22, a wafer scale image sensor package 21, a light source 25, a blocking member 23 and a securing member 24. The chip 21 is attached to a front side 22S of the substrate 22 and has an active area 132 (as shown in FIG. 1). The light source 25 is attached to the front side 22S of the substrate 22 and emits light going outward from the front side 22S. The blocking member 23 covers a part of the chip 21; for example, the blocking member 23 may have an opening 232 to expose at least the active area 132 (FIG. 1) of the chip 21. The securing member 24 fits the blocking member 23 and is configured to secure the blocking member 23 to the substrate 22, wherein the securing member 24 preferably has a first transparent area 241 associated with the light source 25 and a second transparent area 242 associated with the opening 232 of the blocking member 23. The first transparent area 241 allows the light emitted from the light source 25 to emanate from the optical mechanism and to reach the reflecting surface S. The second transparent area 242 allows reflected light reflected from the reflecting surface S outside the optical mechanism to pass through and to reach the active area 132 of the die 13 through the opening 232 of the blocking member 23.

The optical mechanism of the present disclosure is generally disposed inside a housing 3, such as a mouse shell, and the housing 3 may be disposed on a reflecting surface S for being operated by a user and the housing 3 has a bottom hole 30. The light emitted from the light source 25 illuminates the reflecting surface S through the first transparent area 241 and the bottom hole 30. The reflected light (including stray light) from the reflecting surface S passes through the bottom hole 30 again and then reaches the active area 132 of the chip 21 through the second transparent area 242 and the opening 232.

In the present disclosure, most part of the chip 21 is covered by the blocking member 23 such that the light can reach the chip 21 only through the opening 232 of the blocking member 23 upon the chip 21 so as to block unnecessary light to enter the chip 21. In one embodiment, the blocking member 23 may also surround the light source 25 to prevent the light emitted by the light source 25 from scattering inside the housing 3. Herein the blocking member 23 may further has a lighting hole 231 configured to allow the light emitted by the light source 25 to emanate from the blocking member 23. A shape of the blocking member 23 may be designed corresponding to the chip 21 and the light source 25, and may tightly fit in the securing member 24. After the securing member 24 is fixed on the substrate 22, the blocking member 23, the chip 21 and the light source 25 may keep stable relative positions. It is appreciated that if the blocking member 23 can cover the chip 21 well, the blocking member 23 may not surround the light source 25.

In the present disclosure, the securing member 24 may be fastened to the substrate 22 using a cantilever structure and at least one hollow may be previously formed on the substrate 22 to allow the cantilever to go through and engage the substrate 22, and a size of the hollow is formed in a way so that the cantilever can go through and the hollow may not tightly embrace the cantilever. More specifically, if a downward surface of the chip 21 is defined as a horizontal plane herein, by combining the blocking member 23 to the chip 21, the blocking member 21 and the chip 21 may keep stable relative positions horizontally. After the securing member 24 is fixed on the substrate 22, as the blocking member 23 is tightly fit in the securing member 24, the securing member 24, the blocking member 23 and the chip 21 may keep stable relative positions vertically at a vertical plane which is perpendicular to the defined horizontal plane.

It is clear from FIG. 2 that light guiding structures may be formed in front of the opening 232 of the blocking member 23 (i.e. the second transparent area 242) and the light source 25 (i.e. the first transparent area 241) on the securing member 24. In this embodiment, the light guiding structure associated with the light source 25 is configured to allow the light emitted from the light source 25 to be directed to the reflecting surface S and the light guiding structure associated with the chip 21 is configured to converge the reflected light from the reflecting surface S. Accordingly, the first transparent area 241 and the second transparent area 242 may be lens structures. It is appreciated that a propagation direction of light in FIG. 2 is only exemplary.

Figure 3:
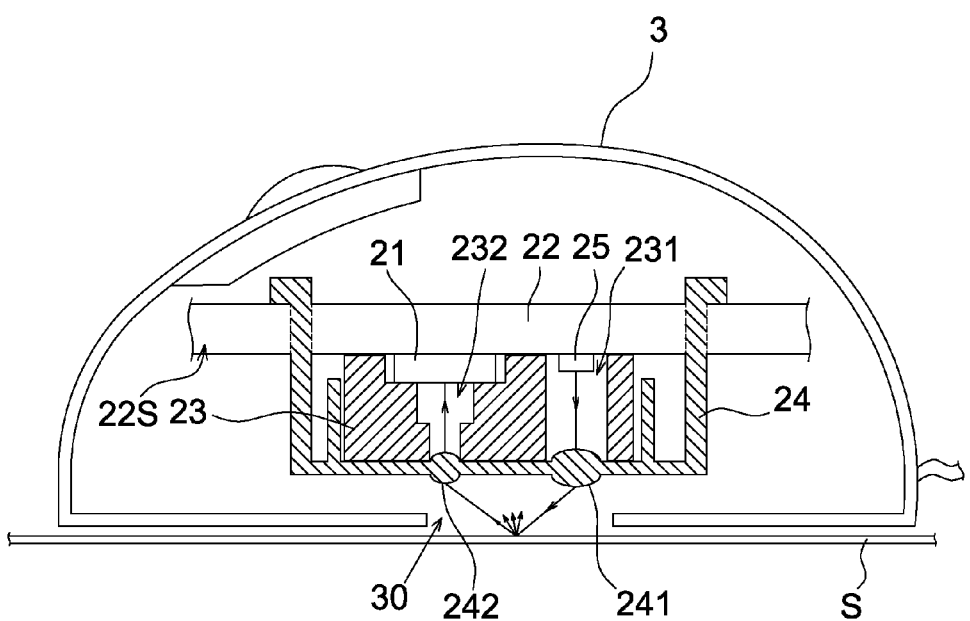
FIG. 3 shows another schematic diagram of an optical mechanism and an optical mouse including the optical mechanism according to the embodiment of the present disclosure.

In order to show the relative relationship between every element, an explosion-like diagram is shown in FIG. 2 and actually the securing member 24 and the blocking member 23 and/or the blocking member 23 and the chip 21 are designed to be tightly combined together such that the blocking member 23 and the chip 21 may keep stable relative positions by using the securing member 24 (as shown in FIG. 3), wherein the chip 21 may be bonded to the substrate 22 through solder balls or bonding pads. In addition, the blocking member 23 may select opaque materials of any color, such as a black blocking member.

The substrate 22 mentioned above may be an inflexible substrate such as a PCB substrate and is configured to combine and fix the securing member 24. Meanwhile, a front side 22S of the substrate 22 may have a circuit layout to electrically connect to the chip 21. In addition, the securing member 24 may be fastened to the substrate 22 in other ways, such as a screw may be used to fix the securing member 24 on the substrate 22 so as to keep stable relative positions between every element. In other embodiments, the blocking member 23 itself may be directly fixed on the substrate 22 and then the securing member 24 is fit on the blocking member 23 and fixed to the substrate 22.

As mentioned above, the optical mechanism may keep the wafer scale image sensor package at a predetermined position and block or absorb ambient light outside the image sensing element so that the image sensing system can operate correctly in the image sensor application. In this manner, the optical mechanism and positioning structure of the present disclosure may be applied to the image sensor chip packaged by wafer scale packaging.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. An optical mechanism, comprising:
   a substrate having a front side and a rear side opposite to the front side;
   a wafer scale image sensor package attached to the front side of the substrate and having an active area;
   a light source attached to the front side of the substrate;
   a blocking member attached to the front side of the substrate from a front of the active area of the wafer scale image sensor package to cover the wafer scale image sensor package, the blocking member comprising an opening to expose at least the active area of the wafer scale image sensor package; and a securing member fitting on the blocking member from the front of the active area of the wafer scale image sensor package to secure the blocking member to the front side of the substrate, wherein the securing member comprises a first transparent area associated with the light source and a second transparent area associated with the opening of the blocking member, and the securing member has a first portion engaging the rear side of the substrate, a second portion extending from the first portion, through a hollow in the substrate, to the front side of the substrate, and a third portion connected to the second portion and engaging a front side of the blocking member, wherein the blocking member is sandwiched between the third portion of the securing member and the front side of the substrate.

2. The optical mechanism as claimed in claim 1, wherein the optical mechanism is applied to an optical mouse.

3. The optical mechanism as claimed in claim 1, wherein the first transparent area and the second transparent area are lens structures.

4. The optical mechanism as claimed in claim 1, wherein the blocking member is made of opaque material.

5. The optical mechanism as claimed in claim 1, wherein the wafer scale image sensor package comprises a die and a transparent layer combined together through an intermediate layer, and a filter layer is coated on at least a partial surface of the transparent layer opposite to the active area.

6. The optical mechanism as claimed in claim 5, wherein the transparent layer has an inner surface facing the die and an exterior surface opposite to the inner surface, and the filter layer is coated on at least one of the inner surface and the exterior surface.

7. The optical mechanism as claimed in claim 5, wherein the filter layer is further coated on a sensing surface of the die opposite to the active area.

8. The optical mechanism as claimed in claim 5, wherein the filter layer is an IR pass filter or an infrared and blue filter.

9. The optical mechanism as claimed in claim 7, wherein the filter layer is an IR pass filter or an infrared and blue filter.

10. An optical mechanism of an optical mouse, comprising:
   a substrate;
   a wafer scale image sensor package attached to the substrate;
   a light source attached to the substrate;
   a blocking member attached to the substrate from a front side of the substrate and covering a part of the wafer scale image sensor package and surrounding the light source; and
   a securing member fitting on the blocking member from a same direction in which the wafer scale image sensor package is attached to the substrate to secure the blocking member to the substrate from the front side of the substrate, wherein the securing member has
   a first portion engaging a rear side of the substrate, the rear side opposite to the front side,
   a second portion extending from the first portion, through a hollow in the substrate, to the front side of the substrate, and
   a third portion connected to the second portion and engaging a front side of the blocking member, wherein
   the blocking member is sandwiched between the third portion of the securing member and the front side of the substrate.

11. The optical mechanism as claimed in claim 10, wherein the wafer scale image sensor package comprises a die and a transparent layer combined together through an intermediate layer, and a filter layer is coated on at least a partial surface of at least one of the transparent layer and the die.

12. The optical mechanism as claimed in claim 10, wherein a reflecting layer is coated on at least a partial surface of at least one of the transparent layer and a sensing surface of the die.

13. The optical mechanism as claimed in claim 11, wherein a reflecting layer is coated on at least a partial surface of at least one of the transparent layer and a sensing surface of the die.

14. An optical mechanism, configured to prevent ambient light from entering an active area of a wafer scale image sensor package attached to a substrate, which comprises a light source attached thereto, the optical mechanism comprising:
   a blocking member attached to the substrate from a front of the active area of the wafer scale image sensor package to cover the wafer scale image sensor package from a front side of the substrate, the blocking member comprising an opening to expose at least the active area of the wafer scale image sensor package; and
   a securing member fitting on the blocking member from the front of the active area of the wafer scale image sensor package to secure the blocking member to the substrate from the front side of the substrate, wherein the securing member comprises a first transparent area associated with the light source and a second transparent area associated with the opening of the blocking member, and the securing member has
   a first portion engaging a rear side of the substrate, the rear side opposite to the front side,
   a second portion extending from the first portion, through a hollow in the substrate, to the front side of the substrate, and
   a third portion connected to the second portion and engaging a front side of the blocking member, wherein
   the blocking member is sandwiched between the third portion of the securing member and the front side of the substrate.

15. An optical mechanism of an optical mouse, configured to prevent ambient light from entering a wafer scale image sensor package attached to a substrate, which comprises a light source attached thereto, the optical mechanism comprising:
   a blocking member attached to the substrate from a front side of the substrate and covering a part of the wafer scale image sensor package and surrounding the light source; and
   a securing member fitting on the blocking member from a same direction in which the wafer scale image sensor package is attached to the substrate to secure the blocking member to the substrate from the front side of the substrate, wherein the securing member has
   a first portion engaging a rear side of the substrate, the rear side opposite to the front side,
   a second portion extending from the first portion, through a hollow in the substrate, to the front side of the substrate, and a third portion connected to the second portion and engaging a front side of the blocking member, wherein
the blocking member is sandwiched between the third portion of the securing member and the front side of the substrate.

\* \* \* \* \*